(12) United States Patent
Chen et al.

(10) Patent No.: US 11,773,633 B2
(45) Date of Patent: Oct. 3, 2023

(54) UNLOCK MECHANISM AND SERVER

(71) Applicant: Wiwynn Corporation, New Taipei (TW)

(72) Inventors: Chi-Luen Chen, New Taipei (TW); Jing-Suei Gao, New Taipei (TW); Bo-Kai Wang, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 63 days.

(21) Appl. No.: 17/535,557

(22) Filed: Nov. 24, 2021

(65) Prior Publication Data

US 2023/0085694 A1     Mar. 23, 2023

(30) Foreign Application Priority Data

Sep. 23, 2021   (TW) ................................ 110135386

(51) Int. Cl.
| | | |
|---|---|---|
| *E05C 3/16* | (2006.01) | |
| *H05K 7/14* | (2006.01) | |
| *H05K 5/02* | (2006.01) | |

(52) U.S. Cl.
CPC ............. *E05C 3/16* (2013.01); *H05K 5/0221* (2013.01); *H05K 7/1489* (2013.01)

(58) Field of Classification Search
CPC ...... H05K 7/18; H05K 7/1488; H05K 7/1497; H05K 7/1489; H05K 7/1427; H05K 5/03; H05K 7/1487; B21D 5/00; G11B 33/12; G11B 33/123; F16M 13/022; F16M 13/02; F16M 13/025; E05C 3/16; E05C 1/166; E05C 9/04; E05C 9/02; E05B 65/00; E05B 15/0053; E05B 65/006
See application file for complete search history.

(56) References Cited

U.S. PATENT DOCUMENTS

| | | | | |
|---|---|---|---|---|
| 5,340,340 | A * | 8/1994 | Hastings | H05K 7/1489 |
| 8,435,057 | B1 * | 5/2013 | Jun | H05K 7/1409 |
| | | | | 439/157 |
| 9,420,716 | B2 * | 8/2016 | Ivey | H05K 7/1415 |
| 2013/0298614 | A1 * | 11/2013 | Huang | E05B 55/005 |
| | | | | 70/91 |

* cited by examiner

*Primary Examiner* — Ko H Chan
(74) *Attorney, Agent, or Firm* — Winston Hsu

(57) ABSTRACT

An unlock mechanism includes a socket, a handle, a driving member, a driving shaft and a moving member. The socket includes a pivot hole. The handle includes a pivot shaft. The pivot shaft is rotatably disposed in the pivot hole. The driving member is movably disposed in the socket and sleeved on the pivot shaft. The driving member includes an inclined surface. The driving shaft is disposed on the pivot shaft and abuts against the inclined surface. The moving member is connected to the driving member. The handle rotates to drive the driving shaft to rotate, the driving shaft pushes the inclined surface to drive the driving member to move, and the driving member drives the moving member to move.

19 Claims, 21 Drawing Sheets

UNLOCK MECHANISM AND SERVER

BACKGROUND OF THE DISCLOSURE

1. Field of the Disclosure

The disclosure relates to an unlock mechanism and, more particularly, to an unlock mechanism that is easy to operate and labor-saving and a server equipped with the unlock mechanism.

2. Description of the Prior Art

With the rise of big data, machine learning, the Internet of Things, and various network platforms, the demand for servers in life is getting higher and higher. Since the server is a hardware that requires frequent maintenance, a chassis of the server is usually installed in a rack by a sliding manner. To prevent the server from sliding out of the rack due to earthquakes or other external forces, an engaging mechanism must be disposed on the server to fix the server. However, a mechanism on the conventional server for unlocking the engaging mechanism is complicated and not easy to operate, such that it is not beneficial for frequent maintenance of the server.

SUMMARY OF THE DISCLOSURE

The disclosure provides an unlock mechanism that is easy to operate and labor-saving and a server equipped with the unlock mechanism, so as to solve the aforesaid problems.

According to an embodiment of the disclosure, an unlock mechanism comprises a socket, a handle, a driving member, a driving shaft and a moving member. The socket comprises a pivot hole. The handle comprises a pivot shaft. The pivot shaft is rotatably disposed in the pivot hole. The driving member is movably disposed in the socket and sleeved on the pivot shaft. The driving member comprises an inclined surface. The driving shaft is disposed on the pivot shaft and abuts against the inclined surface. The moving member is connected to the driving member. The handle rotates to drive the driving shaft to rotate, the driving shaft pushes the inclined surface to drive the driving member to move, and the driving member drives the moving member to move.

According to another embodiment of the disclosure, a server comprises a chassis, at least one rail, at least one engaging mechanism and at least one unlock mechanism. The at least one rail is disposed at a side of the chassis. The at least one engaging mechanism is disposed on the at least one rail. The at least one unlock mechanism is disposed on the chassis. Each unlock mechanism comprises a socket, a handle, a driving member, a driving shaft and a moving member. The socket comprises a pivot hole. The handle comprises a pivot shaft. The pivot shaft is rotatably disposed in the pivot hole. The driving member is movably disposed in the socket and sleeved on the pivot shaft. The driving member comprises an inclined surface. The driving shaft is disposed on the pivot shaft and abuts against the inclined surface. The moving member is connected to the driving member. The handle rotates to drive the driving shaft to rotate, the driving shaft pushes the inclined surface to drive the driving member to move, and the driving member drives the moving member to move toward the engaging mechanism to push the engaging mechanism.

As mentioned in the above, when a user wants to maintain the server, the user may press a press portion of an operating member to unlock the handle. Then, the user may rotate the handle to drive the moving member to push the engaging mechanism, such that the server is disengaged from an engaging structure of a rack. At this time, the user can easily pull the server out of the rack. Accordingly, the unlock mechanism of the disclosure can achieve the effect of easy operation and labor-saving.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
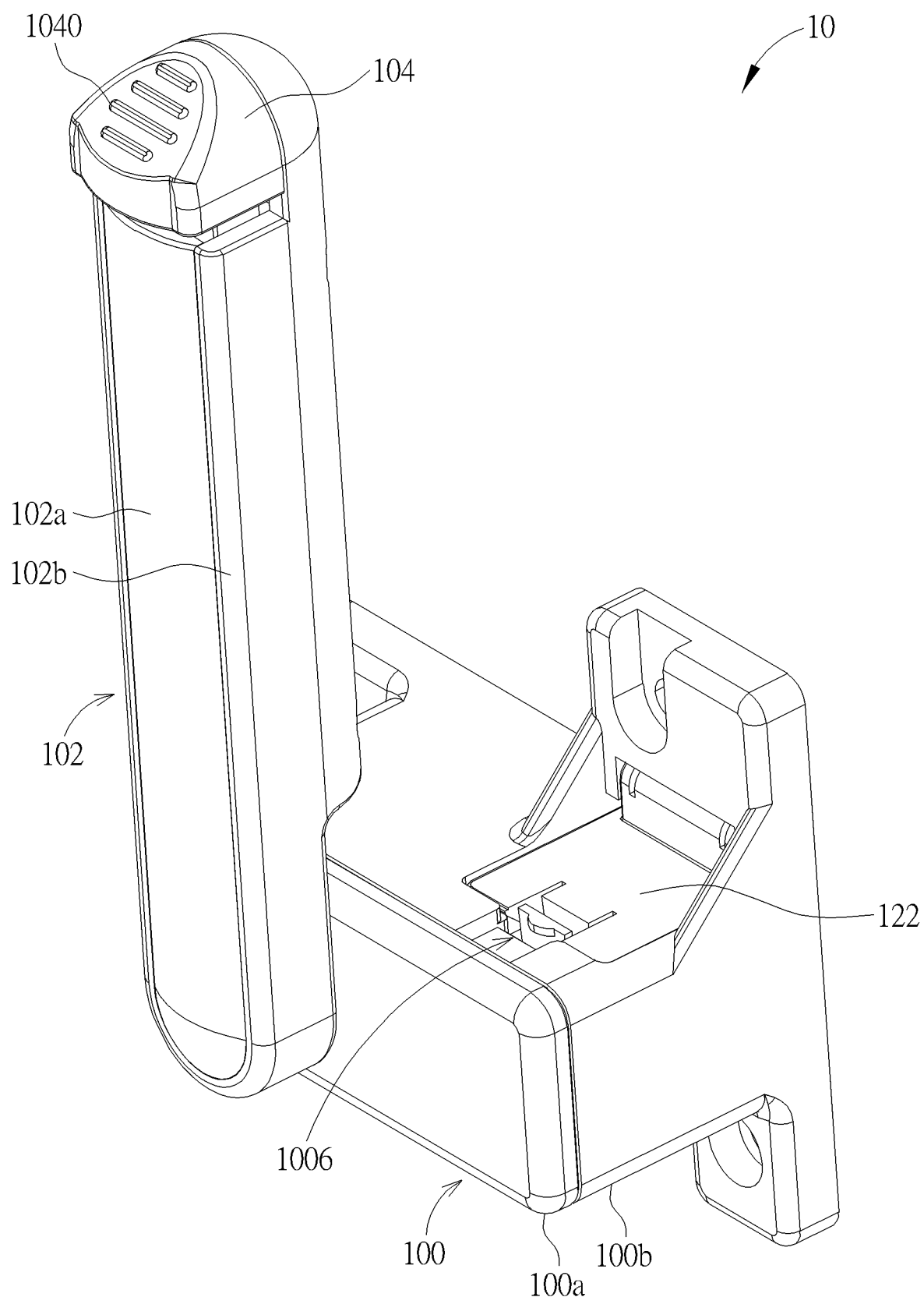
FIG. 1 is a perspective view illustrating an unlock mechanism according to an embodiment of the disclosure.
Figure 2:
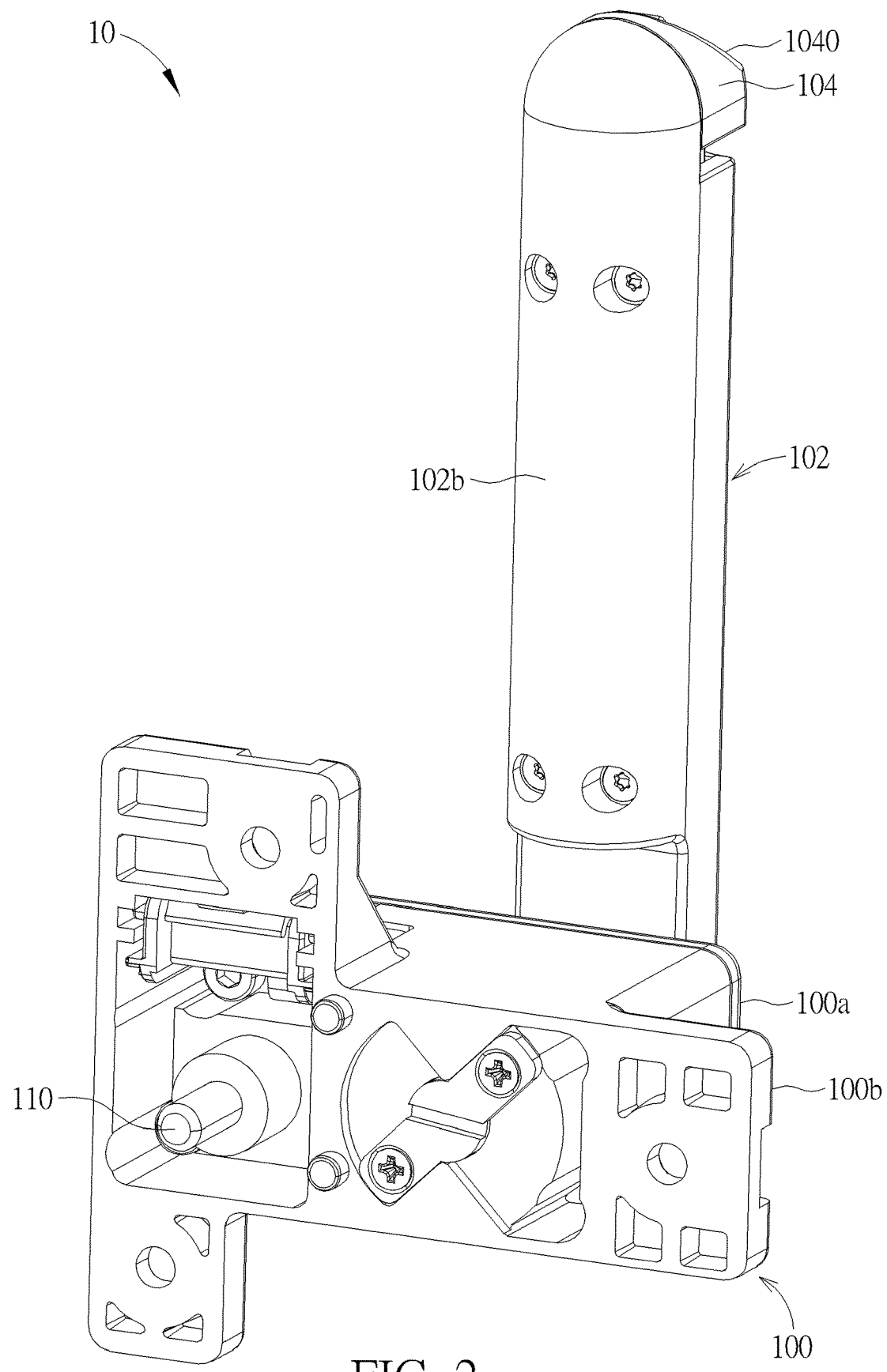
FIG. 2 is a perspective view illustrating the unlock mechanism shown in FIG. 1 from another viewing angle.
Figure 3:
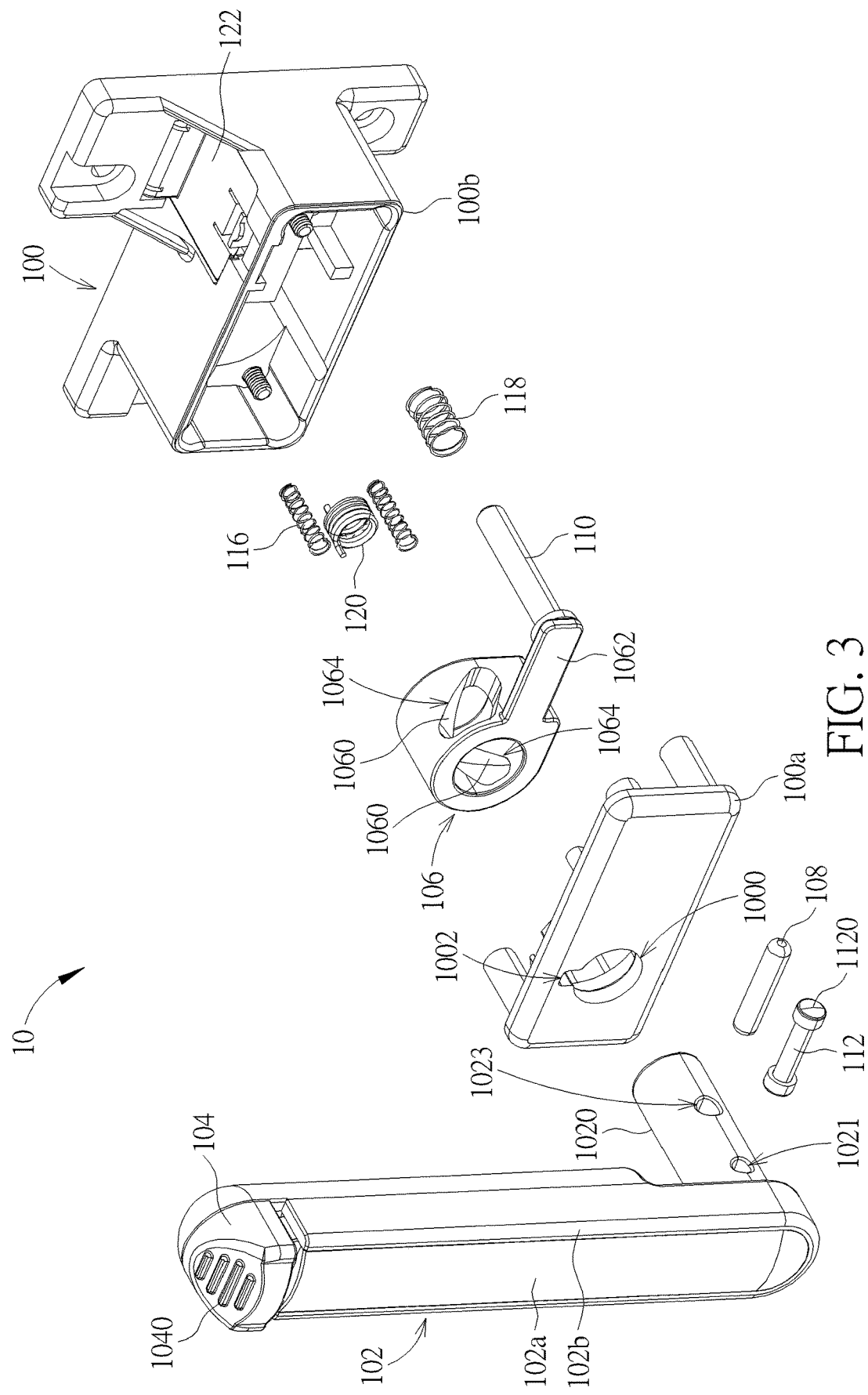
FIG. 3 is an exploded view illustrating the unlock mechanism shown in FIG. 1.
Figure 4:
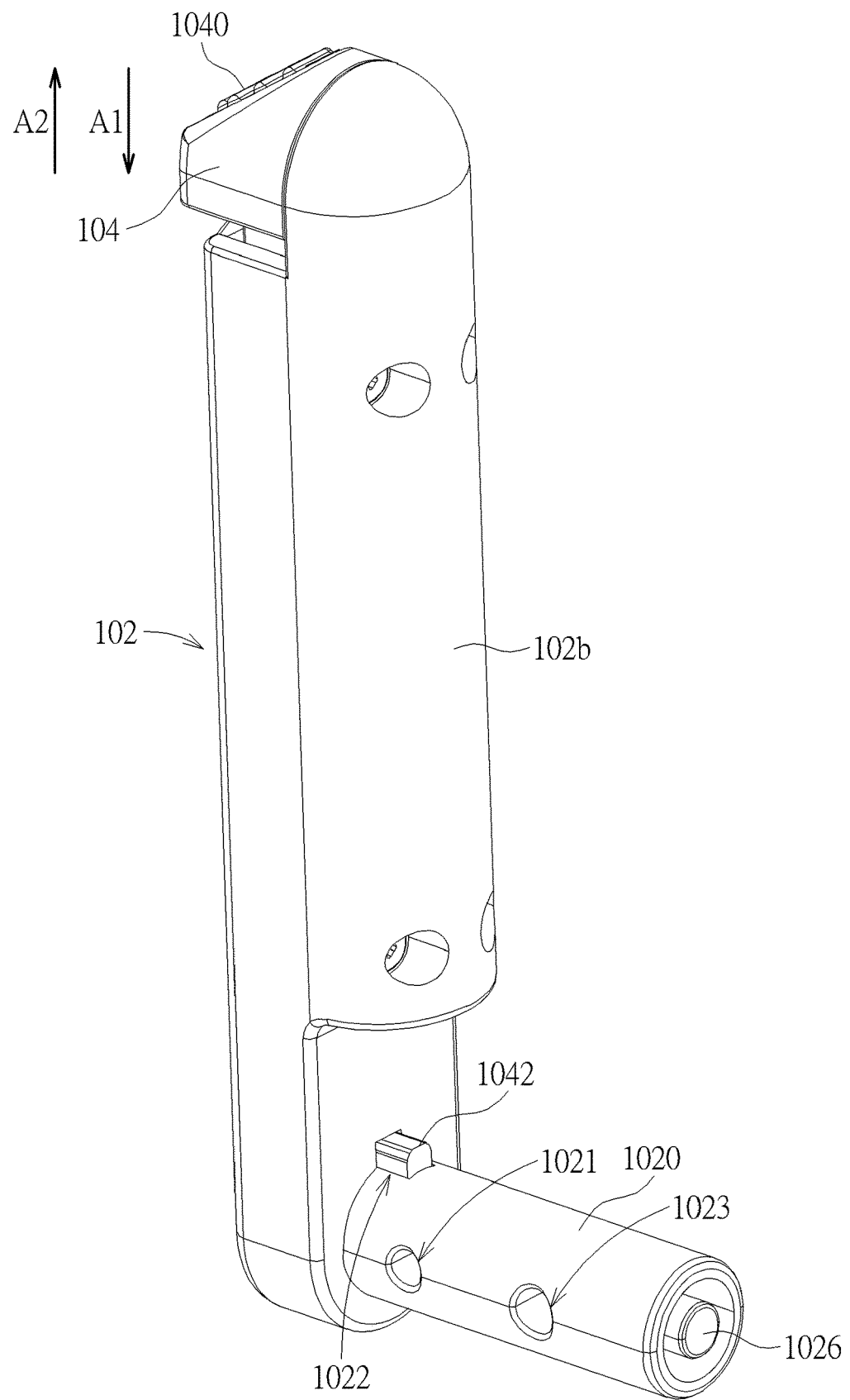
FIG. 4 is a perspective view illustrating a handle shown in FIG. 3 from another viewing angle.
Figure 5:
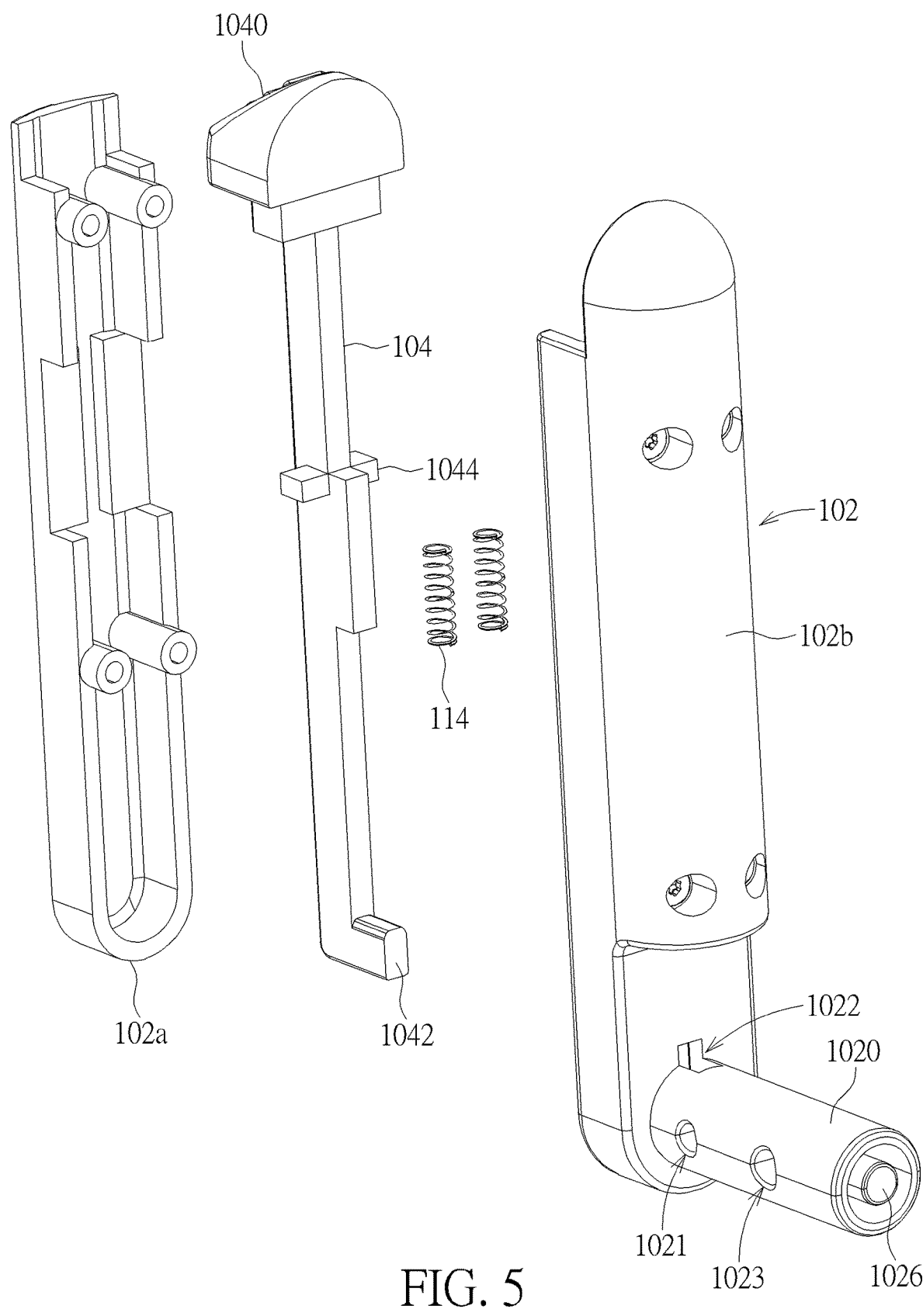
FIG. 5 is an exploded view illustrating the handle shown in FIG. 4.
Figure 6:
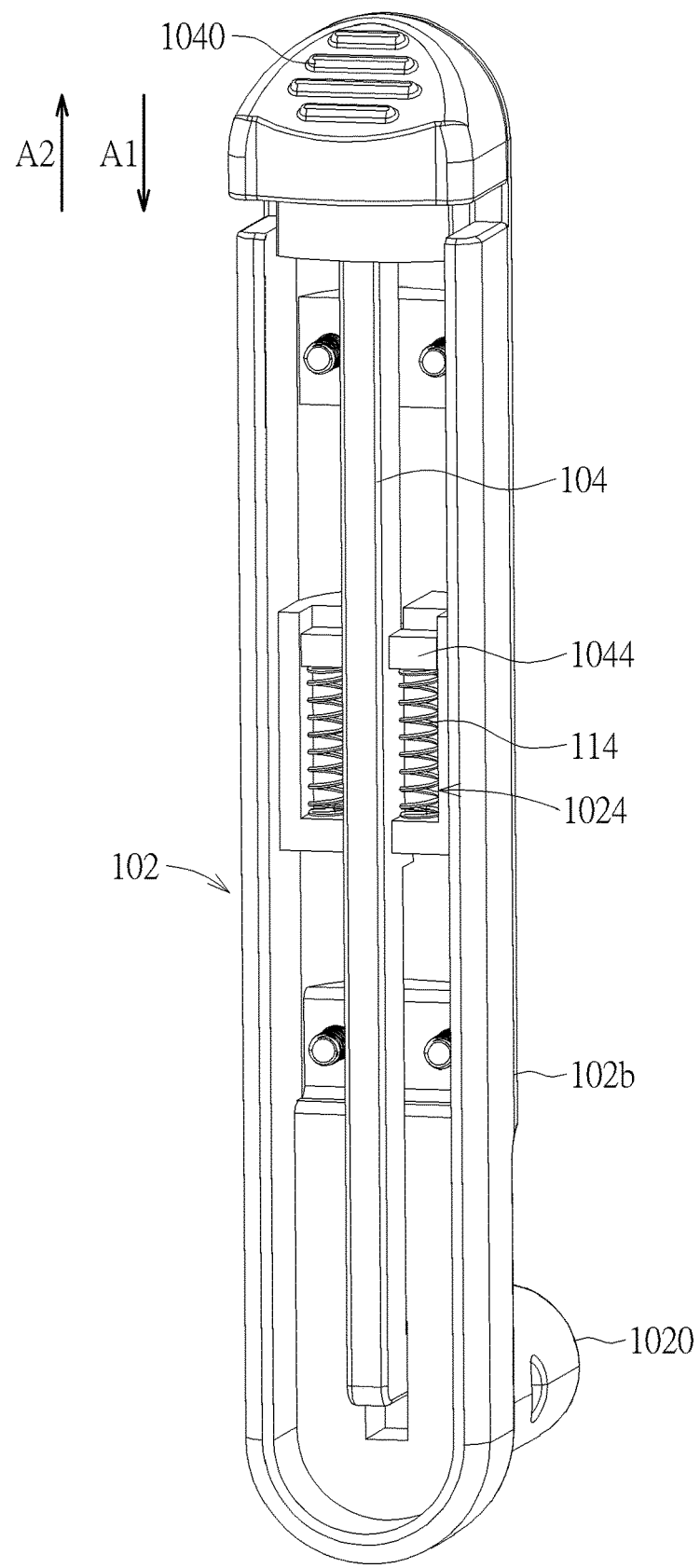
FIG. 6 is an assembly view illustrating an operating member, a first elastic member and a rear cover shown in FIG. 5.
Figure 7:
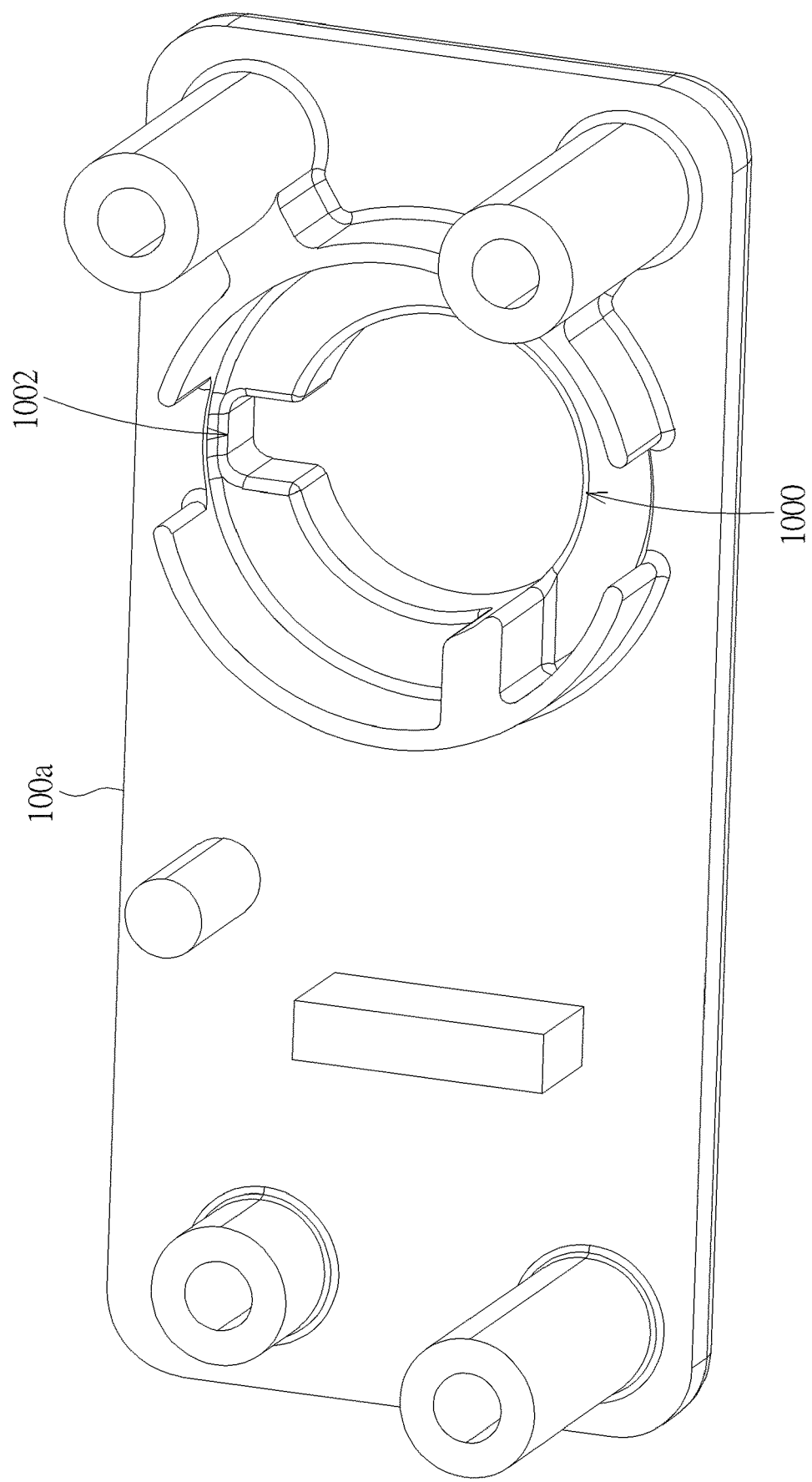
FIG. 7 is a perspective view illustrating a front casing shown in FIG. 3 from another viewing angle.
Figure 8:
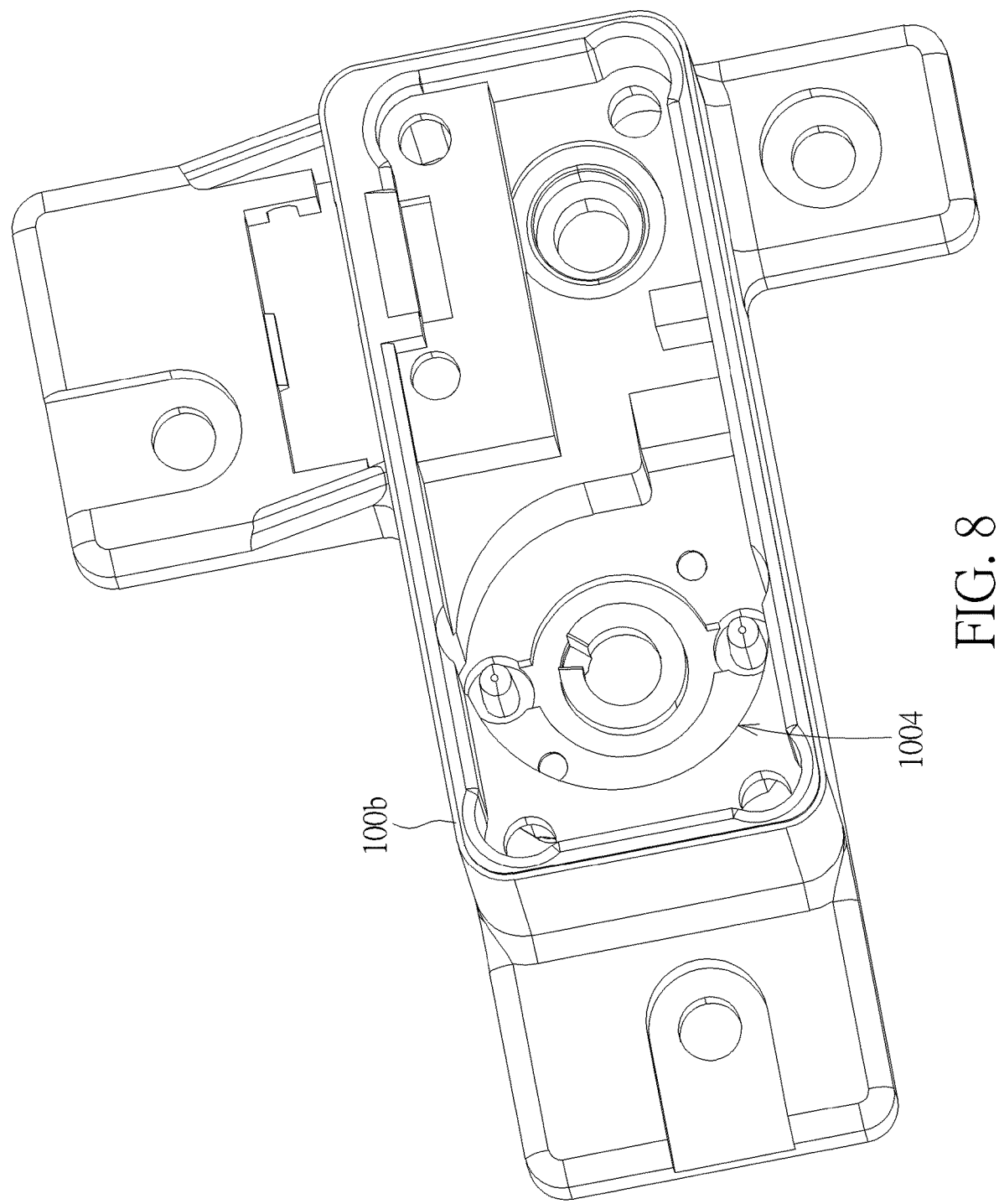
FIG. 8 is a perspective view illustrating a rear casing shown in FIG. 3 from another viewing angle.
Figure 9:
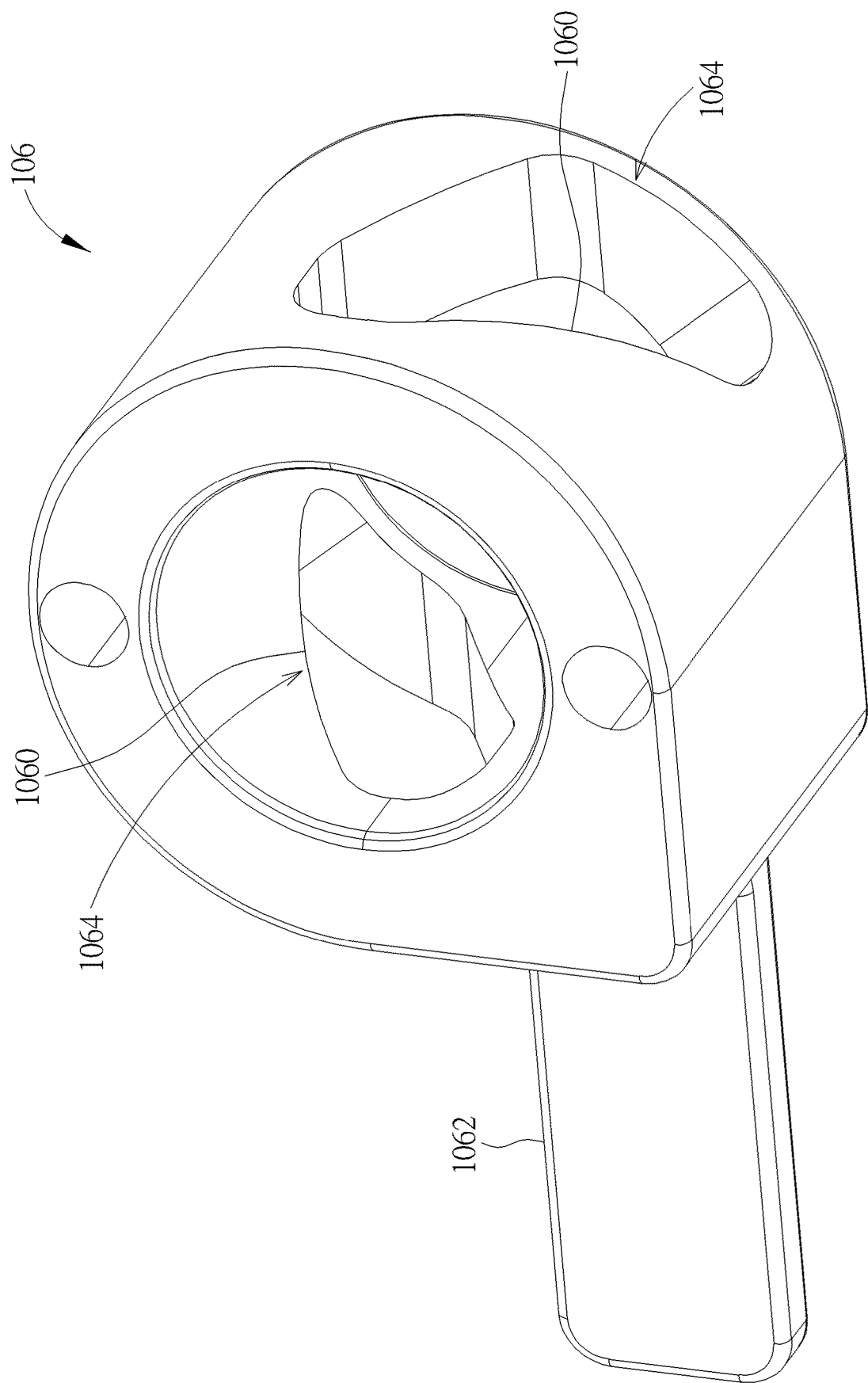
FIG. 9 is a perspective view illustrating a driving member shown in FIG. 3 from another viewing angle.
Figure 10:
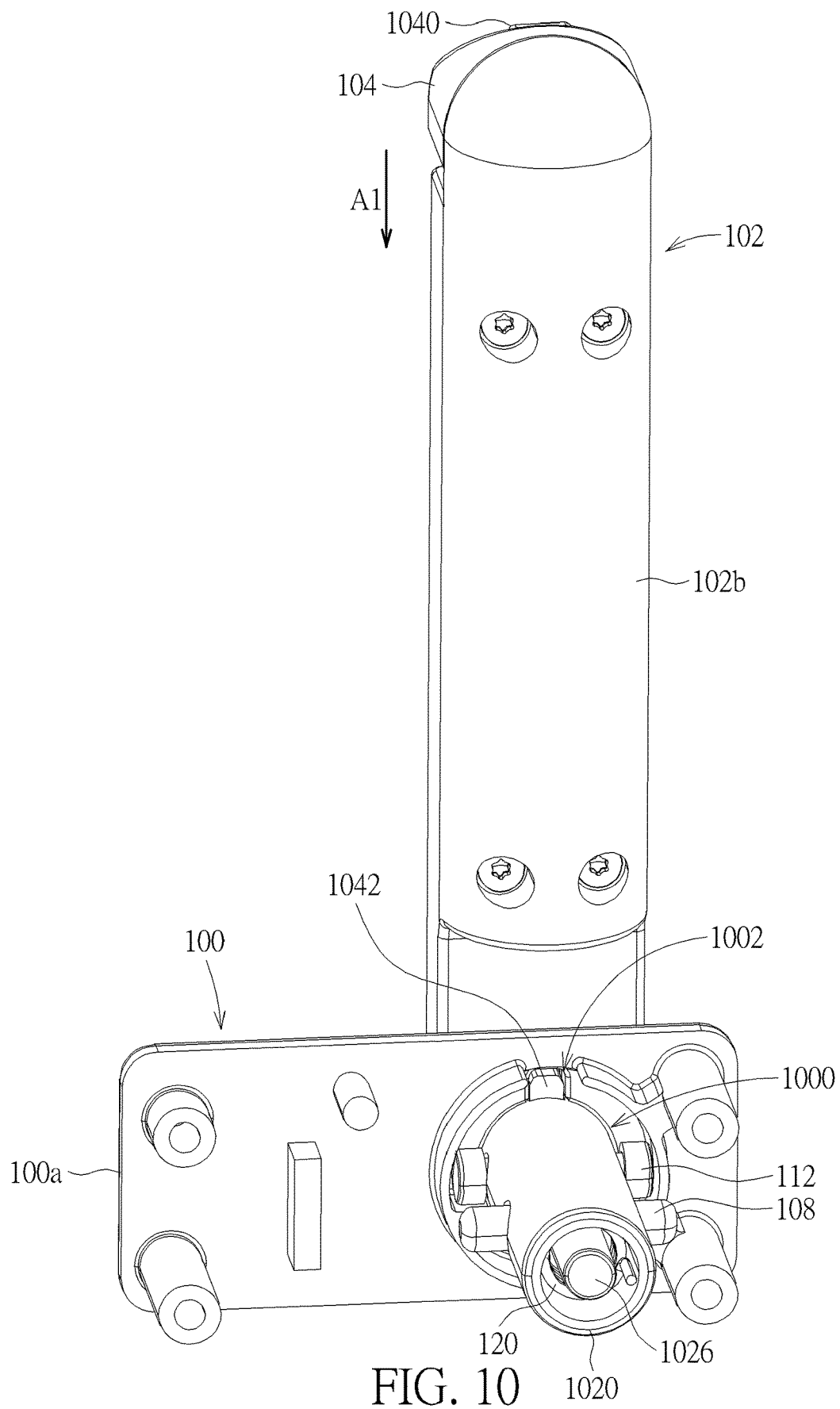
FIG. 10 is an assembly view illustrating the handle and the front casing shown in FIG. 3.
Figure 11:
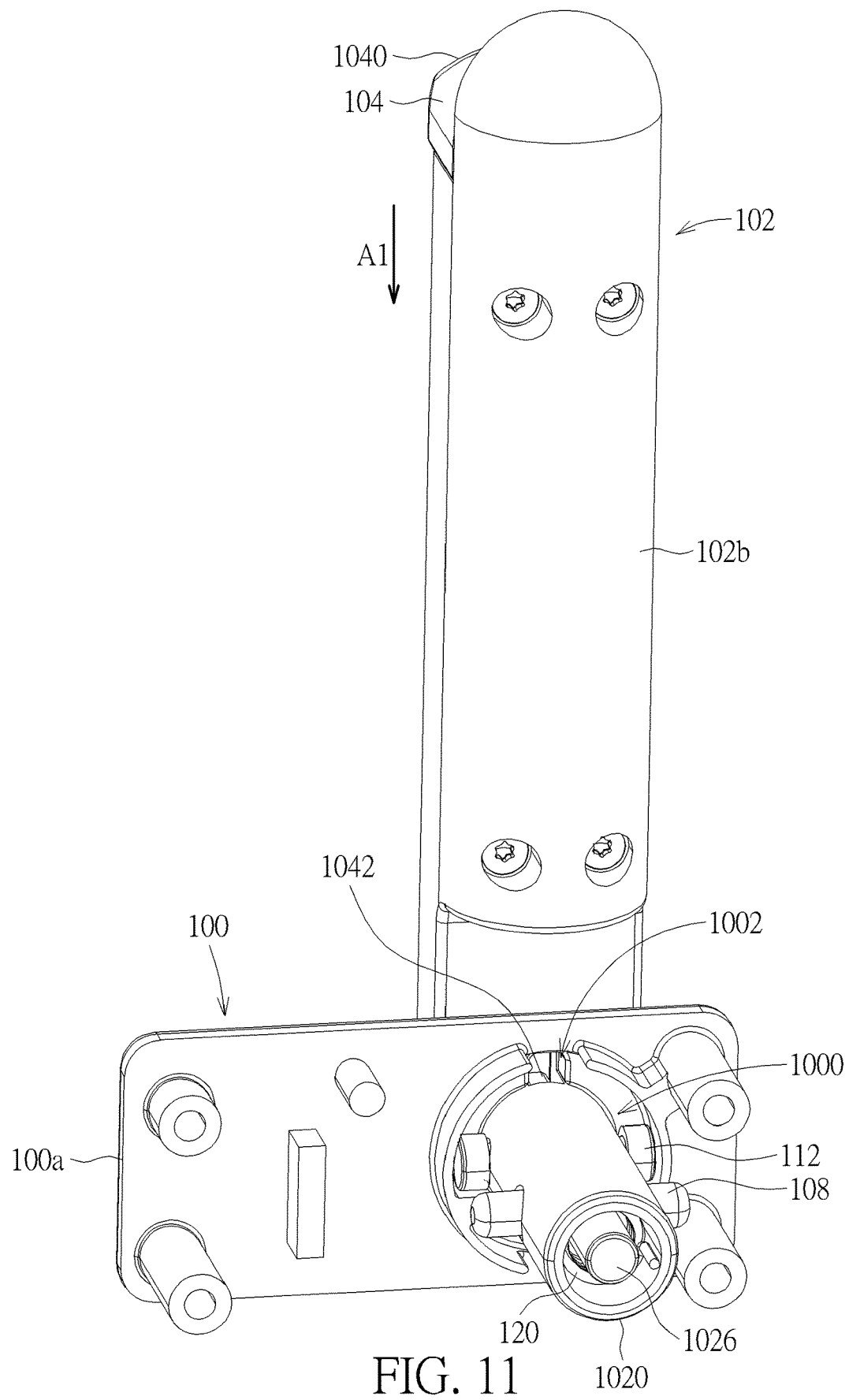
FIG. 11 is a perspective view illustrating the operating member shown in FIG. 10 after being pressed.
Figure 12:
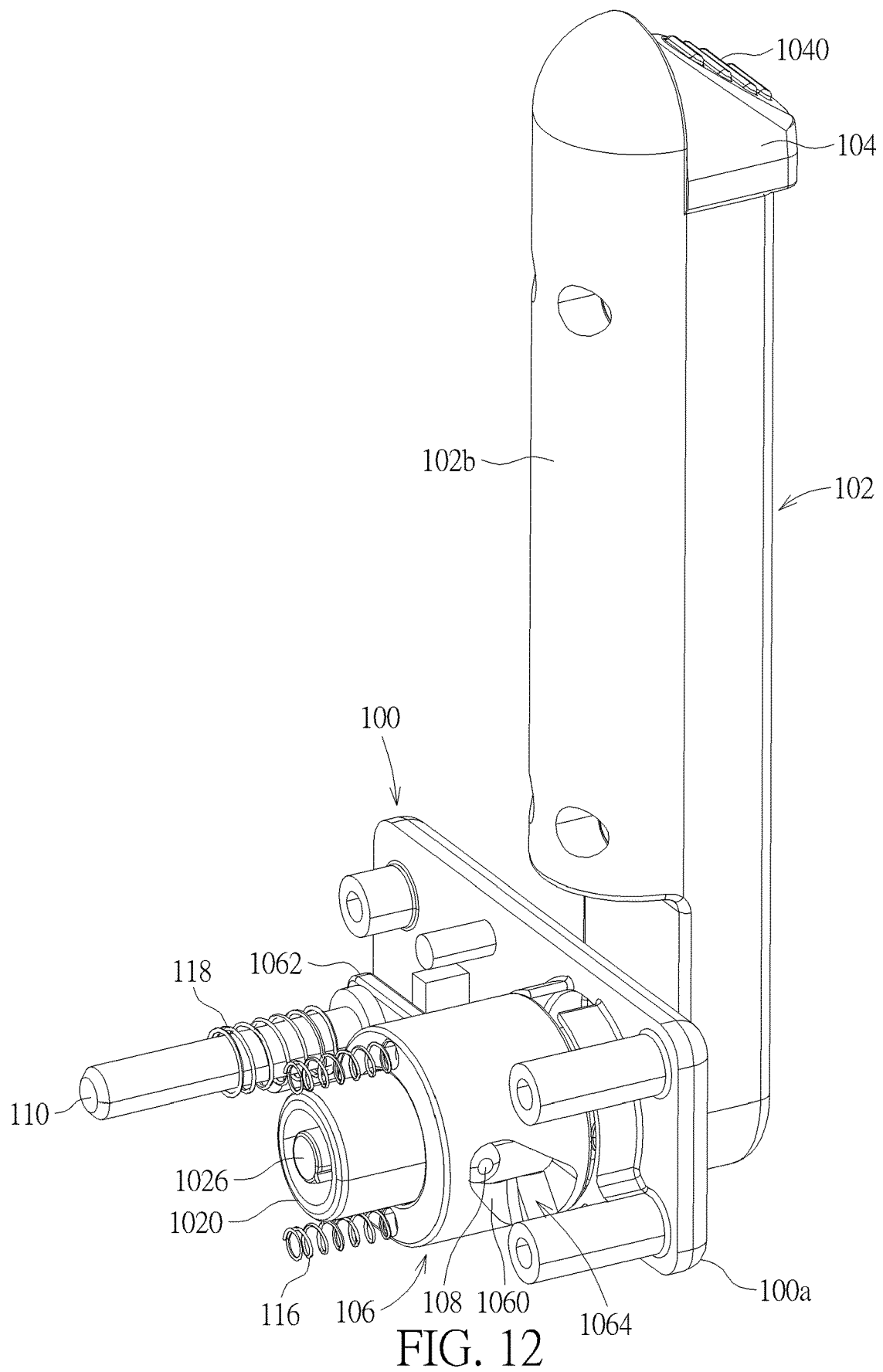
FIG. 12 is a perspective view illustrating the driving member sleeved on a pivot shaft shown in FIG. 11.
Figure 13:
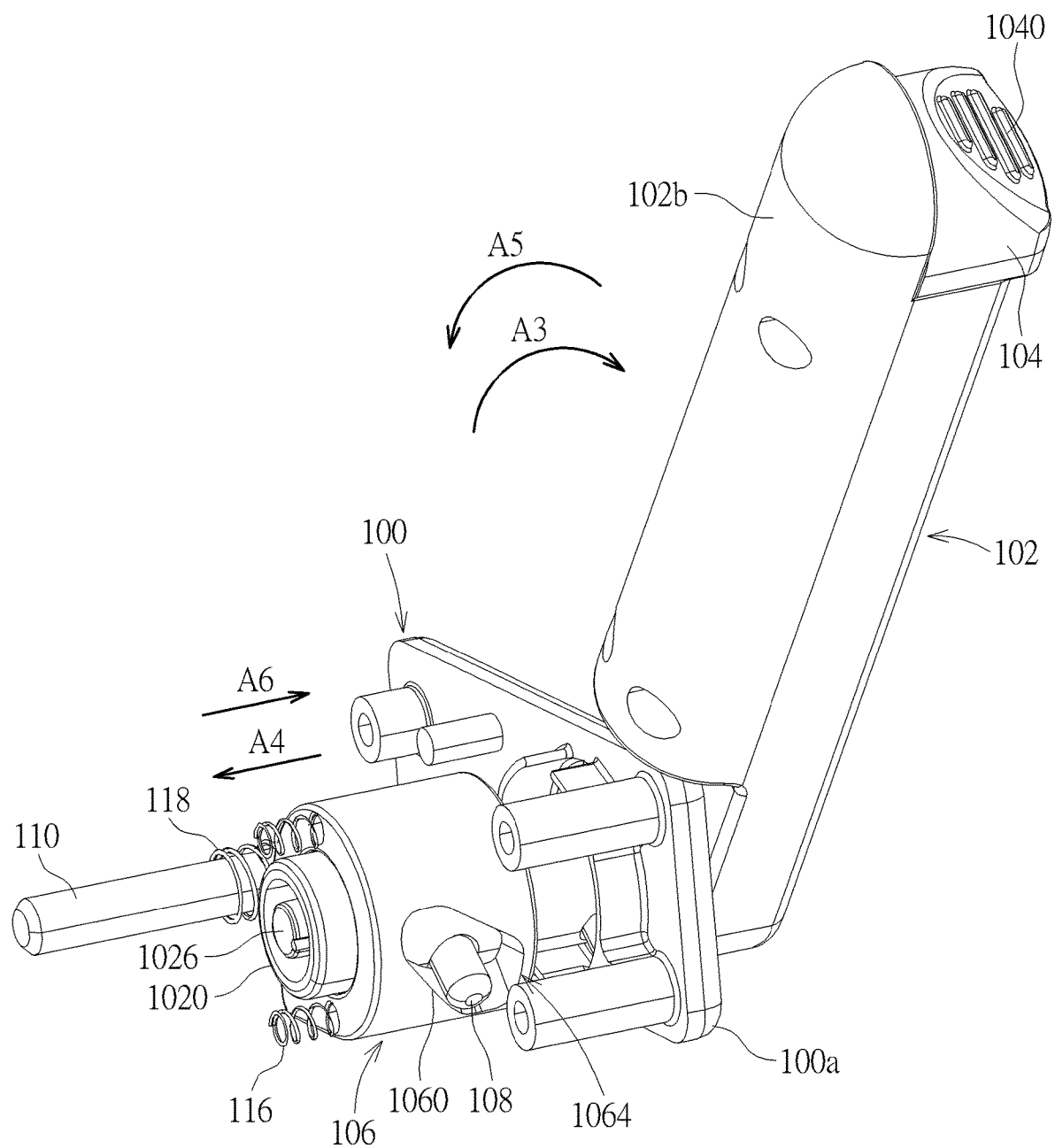
FIG. 13 is a perspective view illustrating the handle shown in FIG. 12 after rotating.

As shown in FIGS. 1 to 13, FIG. 1 is a perspective view illustrating an unlock mechanism 10 according to an embodiment of the disclosure, FIG. 2 is a perspective view illustrating the unlock mechanism 10 shown in FIG. 1 from another viewing angle, FIG. 3 is an exploded view illustrating the unlock mechanism 10 shown in FIG. 1, FIG. 4 is a perspective view illustrating a handle 102 shown in FIG. 3 from another viewing angle, FIG. 5 is an exploded view illustrating the handle 102 shown in FIG. 4, FIG. 6 is an assembly view illustrating an operating member 104, a first elastic member 114 and a rear cover 102b shown in FIG. 5, FIG. 7 is a perspective view illustrating a front casing 100a shown in FIG. 3 from another viewing angle, FIG. 8 is a perspective view illustrating a rear casing 100b shown in FIG. 3 from another viewing angle, FIG. 9 is a perspective view illustrating a driving member 106 shown in FIG. 3 from another viewing angle, FIG. 10 is an assembly view illustrating the handle 102 and the front casing 100a shown in FIG. 3, FIG. 11 is a perspective view illustrating the operating member 104 shown in FIG. 10 after being pressed, FIG. 12 is a perspective view illustrating the driving member 106 sleeved on a pivot shaft 1020 shown in FIG. 11, and FIG. 13 is a perspective view illustrating the handle 102 shown in FIG. 12 after rotating.

As shown in FIGS. 1 to 5, the unlock mechanism 10 comprises a socket 100, a handle 102, an operating member 104, a driving member 106, a driving shaft 108, a moving member 110, a fixing shaft 112, a first elastic member 114, a second elastic member 116, a third elastic member 118, a torsion spring 120 and a cover 122.

The socket 100 comprises a pivot hole 1000 and a restraining recess 1002, wherein the restraining recess 1002 communicates with the pivot hole 1000. In this embodiment, the socket 100 may essentially consist of a front casing 100a and a rear casing 100b, but the disclosure is not so limited. The pivot hole 1000 and the restraining recess 1002 may be located at the front casing 100a.

The handle 102 comprises a pivot shaft 1020 and a through hole 1022, wherein the through hole 1022 is located at an end of the pivot shaft 1020 and communicates with an inner space of the handle 102. In this embodiment, the handle 102 may essentially consist of a front cover 102a and a rear cover 102b, but the disclosure is not so limited. The pivot shaft 1020 and the through hole 1022 may be located at the rear cover 102b.

The operating member 104 is movably disposed in the handle 102. The operating member 104 comprises a press portion 1040 and a restraining portion 1042, wherein the press portion 1040 and the restraining portion 1042 are located at opposite sides of the operating member 104 respectively. As shown in FIG. 4, the press portion 1040 of the operating member 104 is exposed from the handle 102 and the restraining portion 1042 of the operating member 104 protrudes from the through hole 1022 of the handle 102.

As shown in FIG. 6, the first elastic member 114 is disposed in the rear cover 102b of the handle 102 and opposite ends of the first elastic member 114 abut against the rear cover 102b of the handle 102 and the operating member 104 respectively. The first elastic member 114 may be, but not limited to, a spring. In this embodiment, the rear cover 102b may have two accommodating recesses 1024 for accommodating two first elastic members 114. Furthermore, the operating member 104 may have two protruding portions 1044, wherein the two protruding portions 1044 correspond to the two accommodating recesses 1024. Accordingly, opposite ends of the first elastic member 114 may abut against the bottom of the accommodating recess 1024 and the protruding portion 1044 of the operating member 104 respectively.

As shown in FIGS. 4 and 6, when the press portion 1040 of the operating member 104 is pressed toward a direction of an arrow A1, the restraining portion 1042 of the operating member 104 sinks into the through hole 1022 of the handle 102 toward the direction of the arrow A1, and the protruding portion 1044 of the operating member 104 compresses the first elastic member 114. When the press portion 1040 of the operating member 104 is released, an elastic force of the first elastic member 114 pushes the protruding portion 1044 of the operating member 104 toward a direction of an arrow A2 to return the operating member 104. At this time, the restraining portion 1042 of the operating member 104 protrudes from the through hole 1022 of the handle 102 toward the direction of the arrow A2.

As shown in FIG. 10, the pivot shaft 1020 of the handle 102 is rotatably disposed in the pivot hole 1000 of the socket 100, such that the handle 102 can rotate with respect to the socket 100. After the pivot shaft 1020 of the handle 102 is disposed in the pivot hole 1000 of the socket 100, the fixing shaft 112 may be disposed on the pivot shaft 1020 to rotatably restrain the handle 102 on the socket 100. As shown in FIG. 3, in this embodiment, an end portion 1120 of the fixing shaft 112 may be detached. Accordingly, a user may detach the end portion 1120, insert the fixing shaft 112 into an installation hole 1021 of the pivot shaft 1020, and then attach the end portion 1120 to the fixing shaft 112, so as to dispose the fixing shaft 112 on the pivot shaft 1020. At this time, the restraining portion 1042 of the operating member 104 passes through the through hole 1022 (as shown in FIG. 4) of the handle 102 to engage with the restraining recess 1002 of the socket 100 to lock the handle 102, such that the handle 102 cannot rotate.

When the user wants to rotate the handle 102, the user may press the press portion 1040 of the operating member 104. As shown in FIG. 11, the press portion 1040 of the operating member 104 is pressed toward the direction of the arrow A1, such that the restraining portion 1042 of the operating member 104 is disengaged from the restraining recess 1022 of the socket 100 to unlock the handle 102. At this time, the user can rotate the handle 102.

It should be noted that, in another embodiment, the operating member 104 may be omitted from the unlock mechanism 10 and the restraining recess 1022 may be omitted from the handle 102, such that the handle 102 can rotate freely without restraint. In other words, the arrangement of the operating member 104 is optional according to practical applications.

As shown in FIGS. 3 and 12, the driving member 106 is movably disposed in the socket 100 and sleeved on the pivot shaft 1020 of the handle 102. As shown in FIG. 9, the driving member 106 comprises an inclined surface 1060 and an extending portion 1062. In this embodiment, opposite sides of the driving member 106 may comprise two inclined surfaces 1060. As shown in FIGS. 3 and 12, after the driving member 106 is sleeved on the pivot shaft 1020 of the handle 102, the driving shaft 108 may pass through an installation hole 1023 of the pivot shaft 1020 to be disposed on the pivot shaft 1020. At this time, the driving shaft 108 abuts against the inclined surface 1060. As shown in FIG. 13, when the handle 102 rotates toward a direction of an arrow A3 to drive the driving shaft 108 to rotate, the driving shaft 108 pushes the inclined surface 1060 to drive the driving member 106 to move toward a direction of an arrow A4. When the user rotates the handle 102 toward the direction of the arrow A3, the handle 102 rotates around the pivot shaft 1020. Accordingly, the user can easily rotate the handle 102 without excessive force, thereby achieving the effect of labor-saving.

In this embodiment, the inclined surface 1060 may be, but not limited to, a curved surface. Preferably, the inclined surface 1060 may be, but not limited to, a three-dimensional curved surface. The inclined surface 1060 is designed according to a moving trajectory of the driving member 106.

In other words, as long as the inclined surface 1060 can drive the driving member 106 to move toward the direction of the arrow A4, the disclosure does not limit the form of the inclined surface 1060. In this embodiment, the inclined surface 1060 may be a wall surface of a closed hole 1064, as shown in FIG. 9. In another embodiment, the inclined surface 1060 may also be a wall surface of an open recess according to practical applications.

Furthermore, as shown in FIG. 8, the rear casing 100*b* of the socket 100 may further comprise an accommodating recess 1004, wherein a shape of the accommodating recess 1004 corresponds to a shape of the driving member 106. After the assembly of the unlock mechanism 10 is finished, the driving member 106 is accommodated in the accommodating recess 1004 of the rear casing 100*b* of the socket 100, so as to restrain the driving member 106 from rotating. Accordingly, when the handle 102 rotates, the disclosure can ensure that the driving member 106 only moves linearly on the pivot shaft 1020 without rotating.

As shown in FIG. 3, the extending portion 1062 of the driving member 106 extends from a side of the driving member 106 and the moving member 110 is connected to the extending portion 1062. In this embodiment, the moving member 110 and the driving member 106 may be two independent components and an end of the moving member 110 may abut against the extending portion 1062. In another embodiment, the moving member 110 may also be formed on the extending portion 1062 integrally, so as to form one single component with the driving member 106, and it depends on practical applications. As shown in FIGS. 12 and 13, when the driving shaft 108 pushes the inclined surface 1060 to drive the driving member 106 to move toward the direction of the arrow A4, the extending portion 1062 of the driving member 106 drives the moving member 110 to move toward the direction of the arrow A4.

As shown in FIGS. 3 and 12, the second elastic member 116 is disposed in the socket 100 and opposite ends of the second elastic member 116 abut against the rear casing 100*b* of the socket 100 and the driving member 106 respectively. Furthermore, the third elastic member 118 is disposed in the socket 100 and sleeved on the moving member 110, and opposite ends of the third elastic member 118 abut against the rear casing 100*b* of the socket 100 and the moving member 110 respectively. The second elastic member 116 and the third elastic member 118 may be, but not limited to, springs. In this embodiment, the unlock mechanism 10 may comprise two second elastic members, but the disclosure is not so limited.

As shown in FIG. 13, when the handle 102 rotates toward the direction of the arrow A3 to drive the driving member 106 and the moving member 110 to move toward the direction of the arrow A4, the driving member 106 and the moving member 110 compress the second elastic member 116 and the third elastic member 118. When the handle 102 rotates toward a direction of an arrow A5, the elastic forces of the second elastic member 116 and the third elastic member 118 pushes the driving member 106 and the moving member 110 toward a direction of an arrow A6 to return the driving member 106 and the moving member 110. In this embodiment, a rotating direction of the handle 102 (the directions of the arrows A3, A5) is perpendicular to a moving direction of the moving member 110 (the directions of the arrows A4, A6), but the disclosure is not so limited.

As shown in FIG. 10, the pivot shaft 1020 of the handle 102 may comprise a pillar 1026 and the torsion spring 120 is sleeved on the pillar 1026. Opposite ends of the torsion spring 120 may be connected to the rear casing 100*b* of the socket 100 and the pivot shaft 1020 of the handle 102 respectively. Accordingly, when the handle 102 is released at the position shown in FIG. 13, the elastic force of the torsion spring 120 drives the handle 102 to rotate toward the direction of the arrow A5 to return the handle 102.

As shown in FIG. 1, the rear casing 100*b* of the socket 100 may further comprise an opening 1006. The cover 122 is movably disposed on the rear casing 100*b* of the socket 100 and covers the opening 1006. In this embodiment, the cover 122 may be pivotally connected to the rear casing 100*b* of the socket 100, such that the cover 122 may rotate with respect to the rear casing 100*b* of the socket 100 to open or close.

Figure 14:
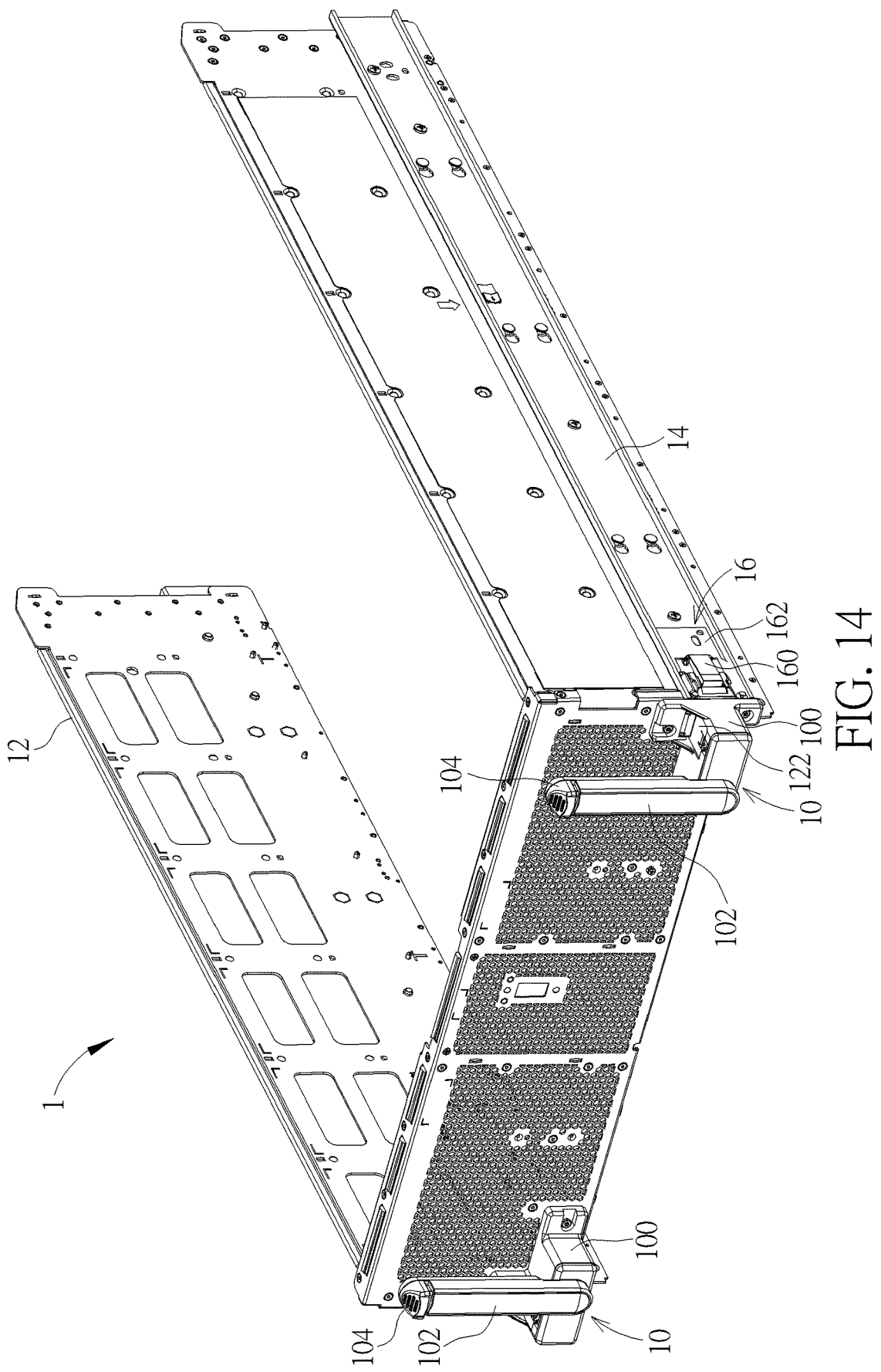
FIG. 14 is a perspective view illustrating a server equipped with the unlock mechanism shown in FIG. 1.
Figure 15:
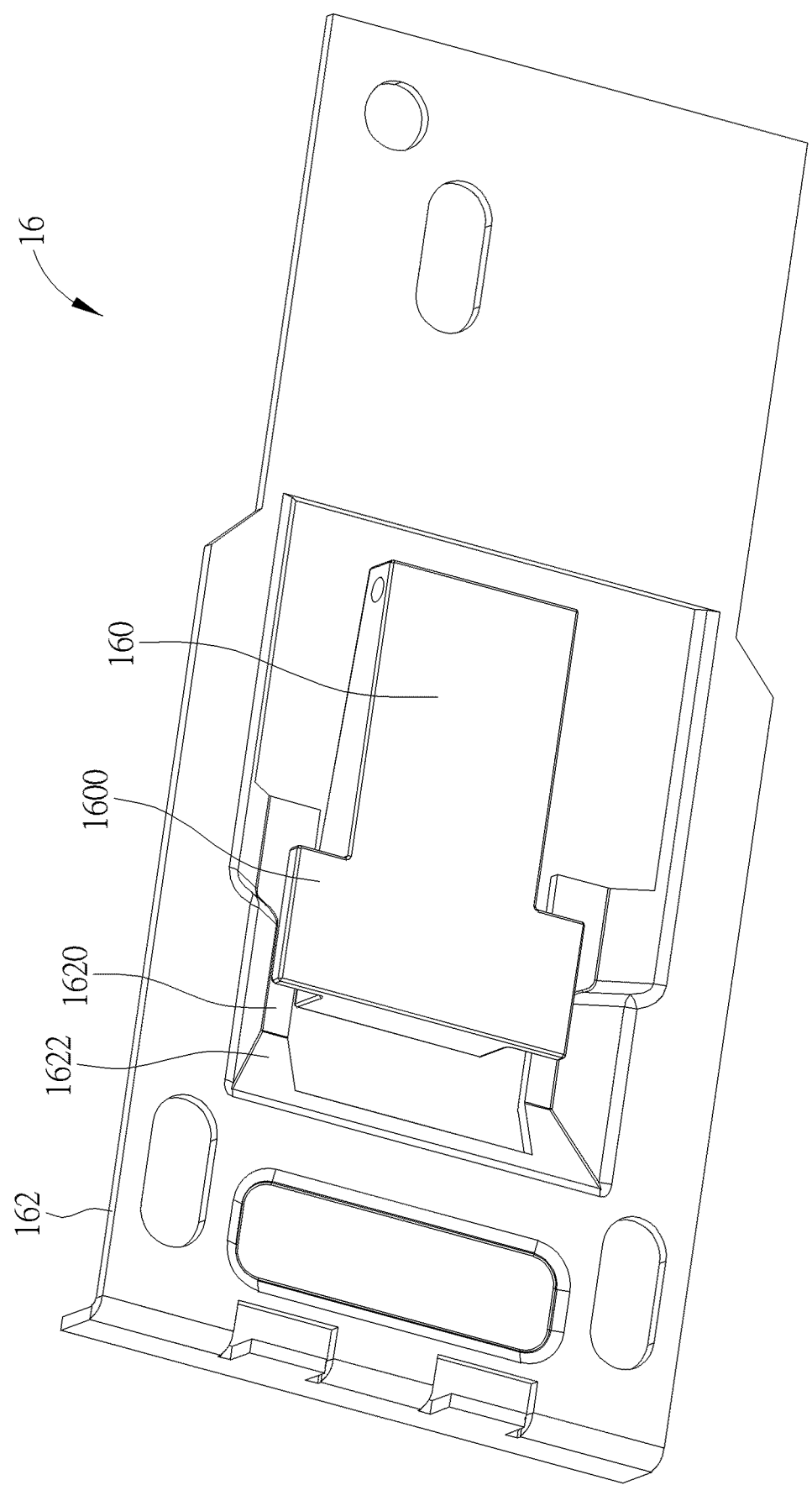
FIG. 15 is a perspective view illustrating an engaging mechanism shown in FIG. 14 from another viewing angle.
Figure 16:
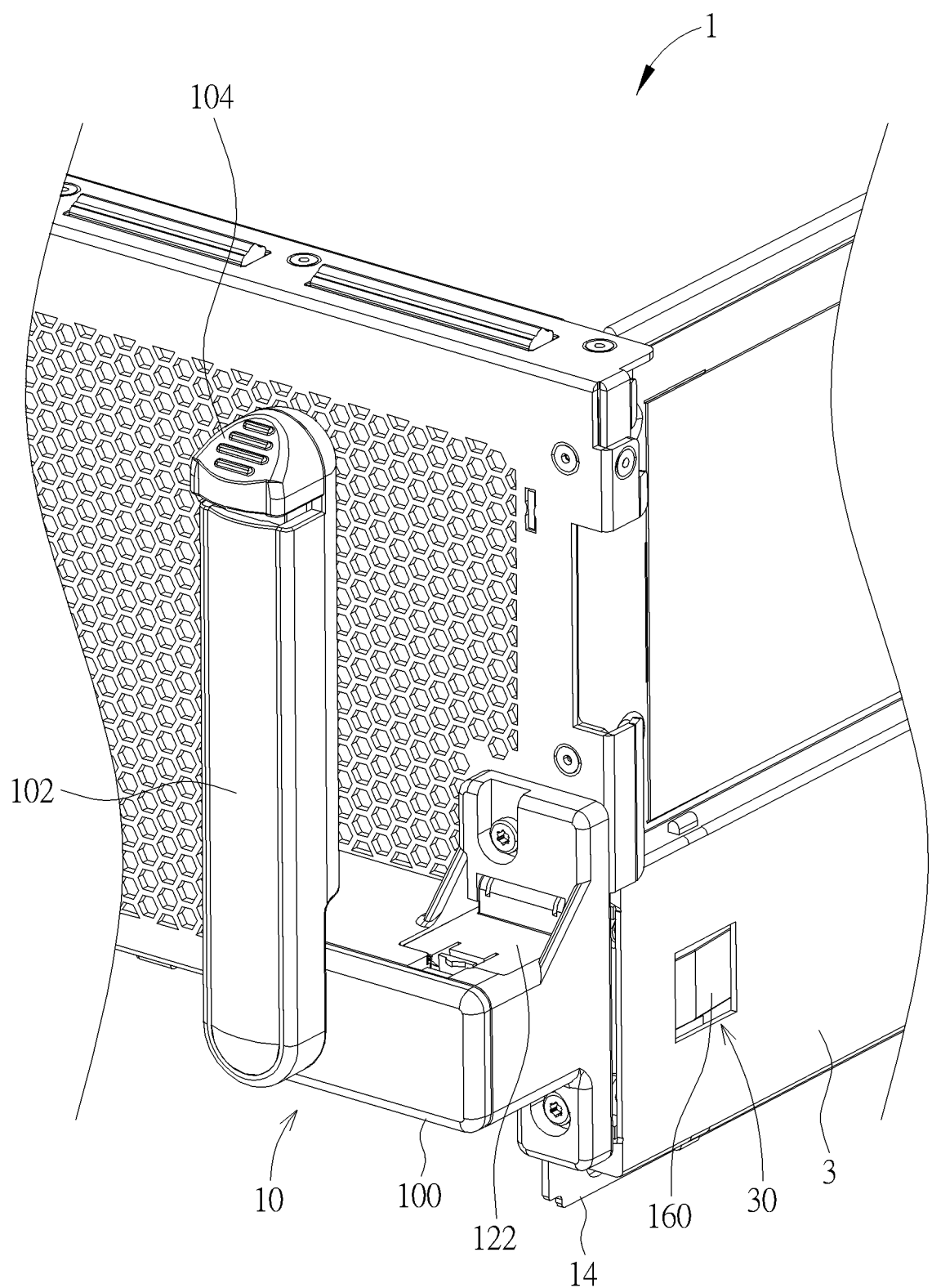
FIG. 16 is a partial perspective view illustrating the server shown in FIG. 14 being installed on an external rail.
Figure 17:
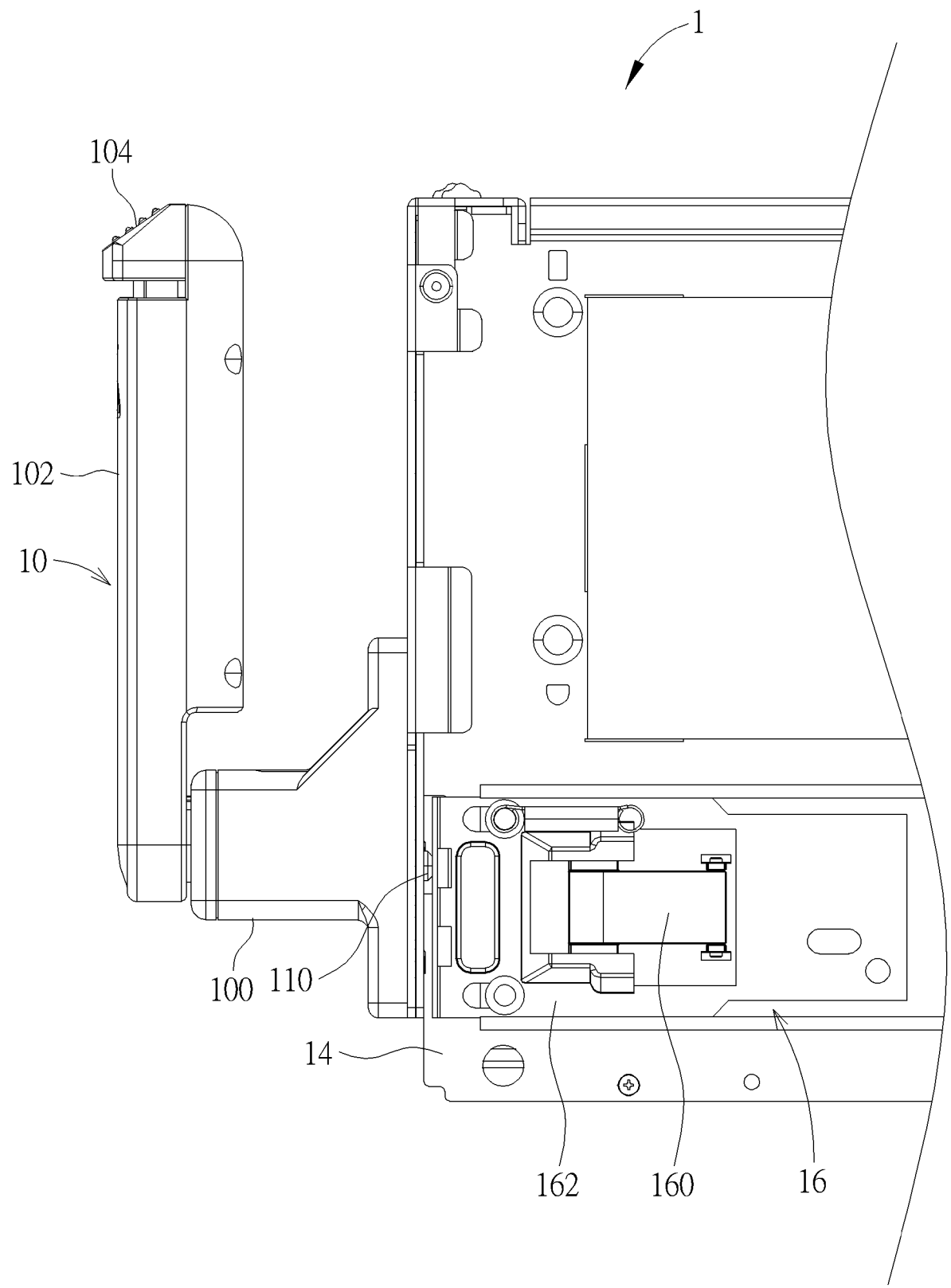
FIG. 17 is a partial side view illustrating the server shown in FIG. 16.
Figure 18:
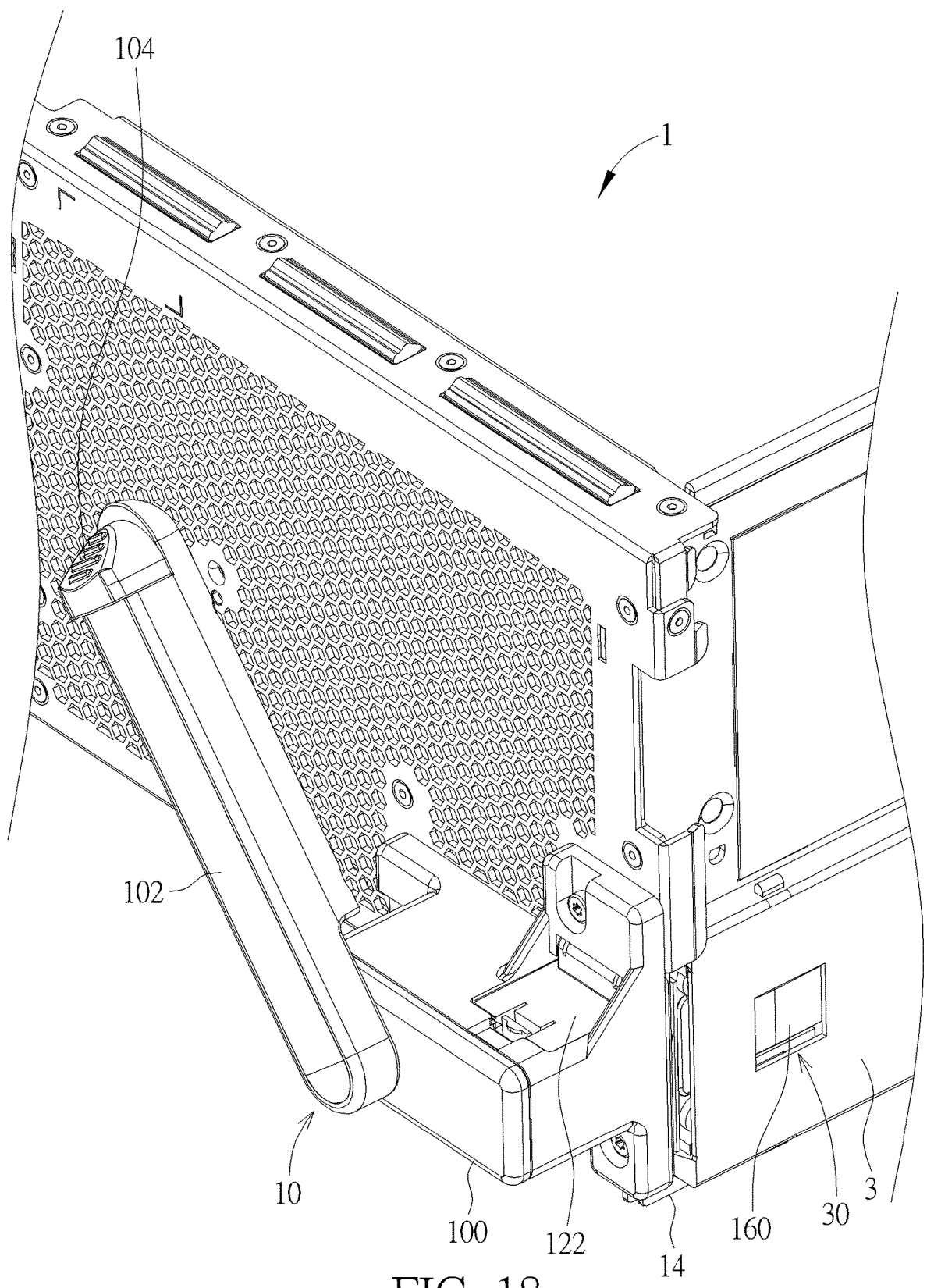
FIG. 18 is a partial perspective view illustrating the handle shown in FIG. 16 after rotating.
Figure 19:
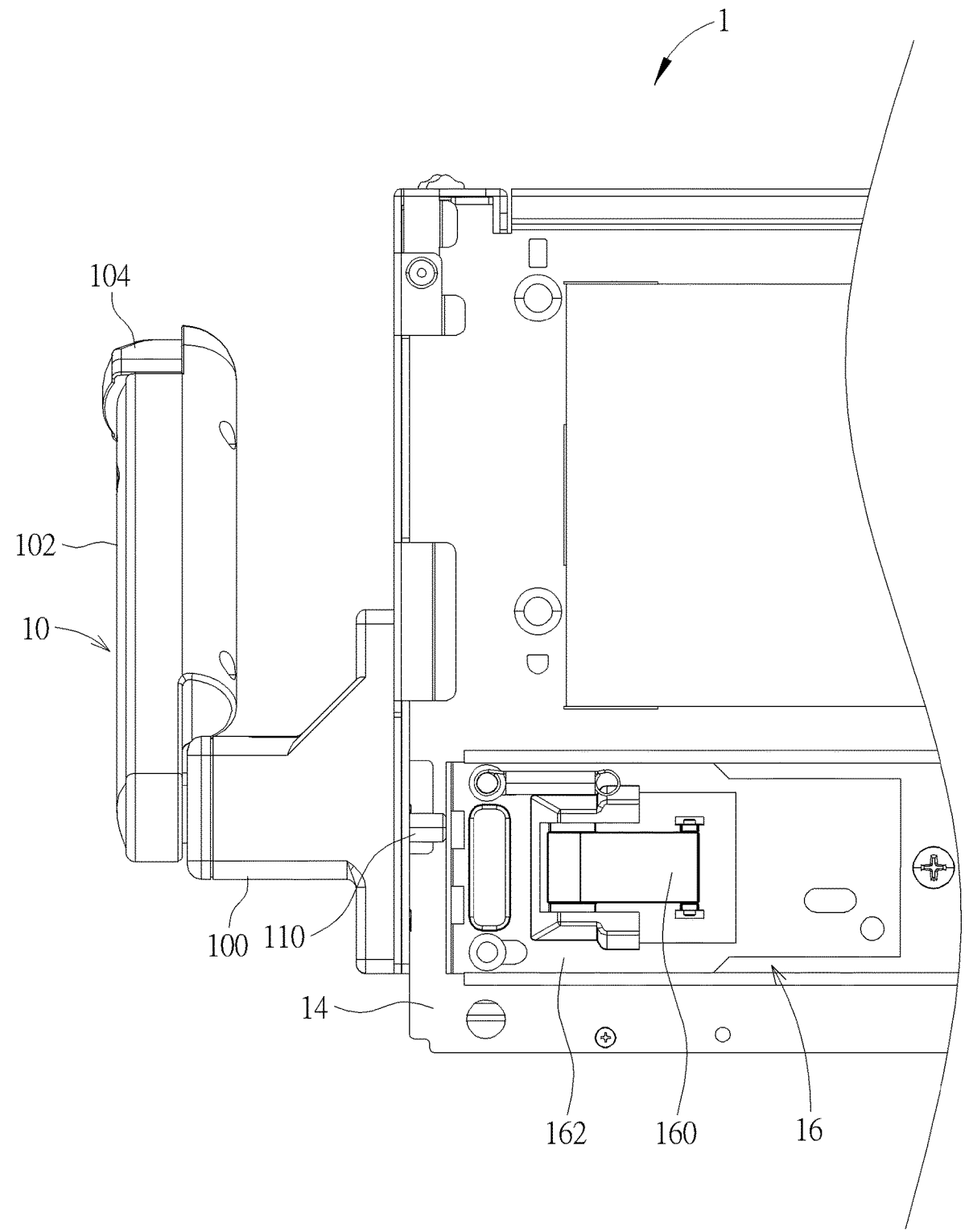
FIG. 19 is a partial side view illustrating the server shown in FIG. 18.
Figure 20:
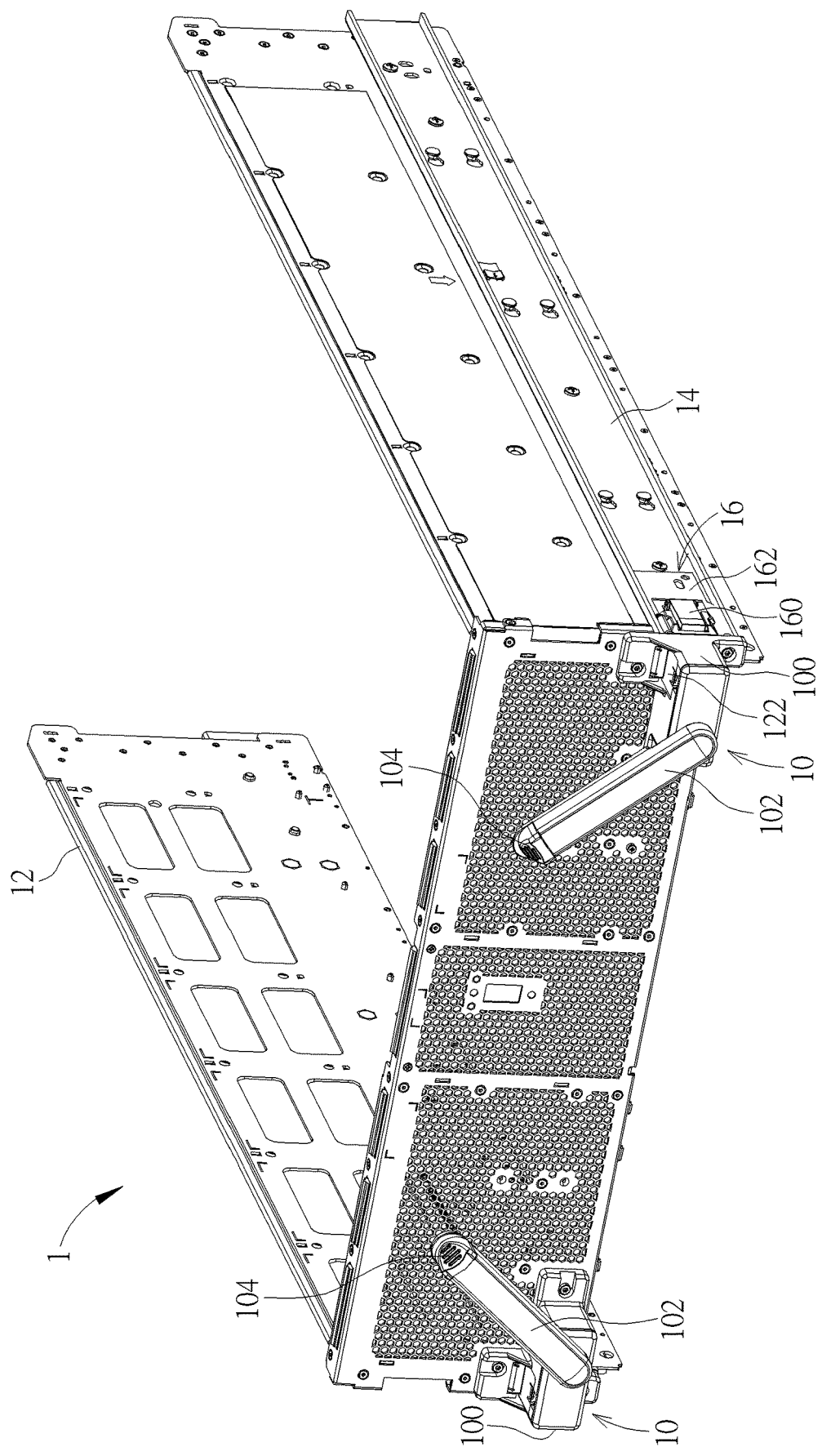
FIG. 20 is a perspective view illustrating two handles shown in FIG. 14 after rotating toward each other.
Figure 21:
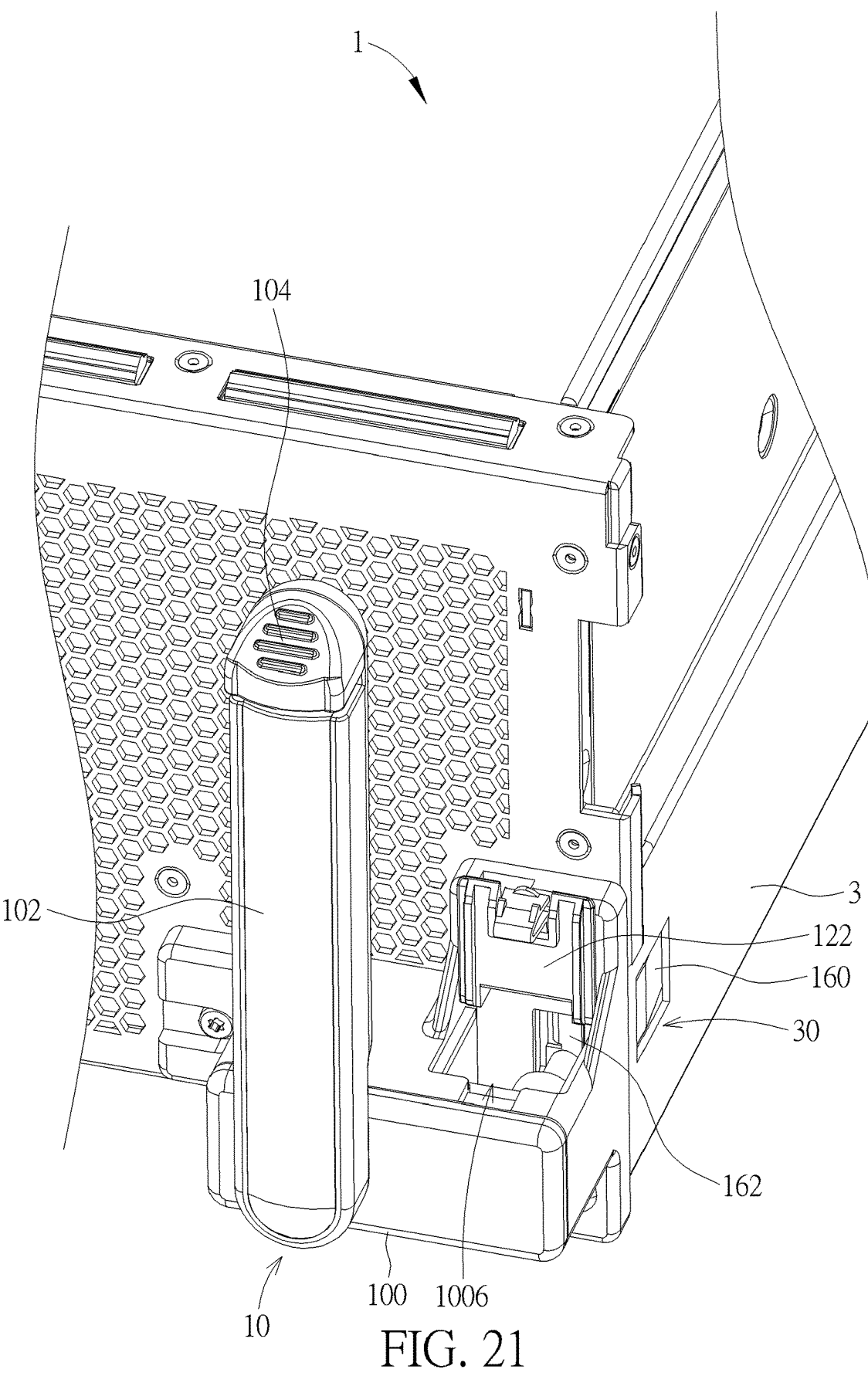
FIG. 21 is a partial perspective view illustrating the cover shown in FIG. 16 after being opened.

As shown in FIGS. 14 to 21, FIG. 14 is a perspective view illustrating a server 1 equipped with the unlock mechanism 10 shown in FIG. 1, FIG. 15 is a perspective view illustrating an engaging mechanism 16 shown in FIG. 14 from another viewing angle, FIG. 16 is a partial perspective view illustrating the server 1 shown in FIG. 14 being installed on an external rail 3, FIG. 17 is a partial side view illustrating the server 1 shown in FIG. 16, FIG. 18 is a partial perspective view illustrating the handle 102 shown in FIG. 16 after rotating, FIG. 19 is a partial side view illustrating the server 1 shown in FIG. 18, FIG. 20 is a perspective view illustrating two handles 102 shown in FIG. 14 after rotating toward each other, and FIG. 21 is a partial perspective view illustrating the cover 122 shown in FIG. 16 after being opened.

As shown in FIG. 14, the server 1 comprises a chassis 12, a rail 14, an engaging mechanism 16 and the aforesaid unlock mechanism 10. In general, the server 1 may be further equipped with some necessary hardware and software components for specific purposes, such as processor, circuit board, memory, power supply, applications, communication module, etc., and it depends on practical applications. The rail 14 is disposed at a side of the chassis 12 and the engaging mechanism 16 is disposed on the rail 14. In this embodiment, the server 1 may comprise two rails 14, two engaging mechanisms 16 and two unlock mechanisms 10, wherein the two rails 14 are disposed at opposite sides of the chassis 12, the two engaging mechanisms 16 are disposed on the two rails 14, and the two unlock mechanisms 10 are disposed at opposite sides of the chassis 12 with respect to the two engaging mechanisms 16. It should be noted that FIG. 14 only illustrates the rail 14 and the engaging mechanism 16 at one side of the chassis 12.

As shown in FIGS. 14 and 15, the engaging mechanism 16 may comprise an engaging member 160 and a sliding member 162, wherein the engaging member 160 is rotatably connected to the rail 14 and the sliding member 162 is slidably disposed on the rail 14. The engaging member 160 may comprise a driving portion 1600 and the sliding member 162 may comprise a stop portion 1620 and a driving inclined surface 1622, wherein the driving inclined surface 1622 is connected to the stop portion 1620. The stop portion 1620 of the sliding member 162 is configured to stop the driving portion 1600 of the engaging member 160, so as to restrain the engaging member 160 from rotating.

As shown in FIG. 16, the rail 14 of the server 1 may be installed on the external rail 3, such that the server 1 is slidably disposed in a rack (not shown). In practical applications, an outer casing (not shown) of the server 1 may be fixed in the rack and the external rail 3 may be disposed on the outer casing. The external rail 3 comprises an engaging structure 30 (e.g. hole). When the rail 14 of the server 1 is installed on the external rail 3, the engaging member 160 engages with the engaging structure 30 to prevent the server 1 from sliding out of the rack due to earthquakes or other external forces. When a user wants to take the server 1 out of the rack, the user may press the operating member 104 first and then rotate the handle 102, as shown in FIG. 18. At this time, the driving member 106 (as shown in FIG. 13) drives the moving member 110 to move toward the engaging mechanism 16 (i.e. the driving member 106 drives the moving member 110 to move toward an outside of the socket 100) to push the engaging mechanism 16. As shown in FIGS. 17 and 19, when the moving member 110 moves toward the engaging mechanism 16, the moving member 110 pushes the sliding member 162. At this time, the driving inclined surface 1622 of the sliding member 162 presses the driving portion 1600 of the engaging member 160 to drive the engaging member 160 to rotate. Then, the engaging member 160 is disengaged from the engaging structure 30 of the external rail 3. Accordingly, the user can take the server 1 out of the rack.

In another embodiment, the disclosure may also adjust the inclined surface 1060 of the driving member 106 to enable the driving member 106 to drive the moving member 110 to move toward an inside of the socket 100 when the handle 102 rotates, so as to disengage a corresponding engaging mechanism (not shown) from the engaging structure 30 of the external rail 3. In other words, the disclosure may change the moving direction of the moving member 110 according to the design of the engaging mechanism, so the disclosure is not limited to the embodiment shown in the figures.

As shown in FIG. 20, in this embodiment, the rotating directions of the two handles 102 of the two unlock mechanisms 10 are opposite and toward to each other, so as to push the two engaging mechanisms 16. It should be noted that FIG. 20 only illustrates the engaging mechanism 16 at one side of the chassis 12. The aforesaid operating manner allows the user to rotate the two handles 102 by two hands more smoothly and then take the server 1 out of the rack more easily.

Moreover, as shown in FIG. 20, when the unlock mechanism 10 fails, the user may open the cover 122 to expose the opening 1006 of the socket 100. At this time, the user may insert an appropriate tool into the opening 1006 to push the sliding member 162, so as to disengage the engaging member 160 from the engaging structure 30 of the external rail 3. Accordingly, even if the unlock mechanism 10 fails, the user can still take the server 1 out of the rack.

As mentioned in the above, when a user wants to maintain the server, the user may press the press portion of the operating member to unlock the handle. Then, the user may rotate the handle to drive the moving member to push the engaging mechanism, such that the server is disengaged from an engaging structure of a rack. At this time, the user can easily pull the server out of the rack. Accordingly, the unlock mechanism of the disclosure can achieve the effect of easy operation and labor-saving.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An unlock mechanism comprising:
a socket comprising a pivot hole;
a handle comprising a pivot shaft, the pivot shaft being rotatably disposed in the pivot hole;
a driving member movably disposed in the socket and sleeved on the pivot shaft, the driving member comprising an inclined surface;
a driving shaft disposed on the pivot shaft and abutting against the inclined surface; and
a moving member connected to the driving member;
wherein a rotating direction of the handle is perpendicular to a moving direction of the moving member; when the handle rotates to drive the driving shaft to rotate, the driving shaft pushes the inclined surface to drive the driving member to move, and the driving member drives the moving member to move toward an outside of the socket.

2. The unlock mechanism of claim 1, further comprising an operating member movably disposed in the handle, the operating member comprising a press portion and a restraining portion, the press portion being exposed from the handle, the handle further comprising a through hole, the through hole being located at an end of the pivot shaft, the socket further comprising a restraining recess, the restraining recess communicating with the pivot hole, the restraining portion passing through the through hole to engage with the restraining recess to lock the handle, the press portion being pressed to disengage the restraining portion from the restraining recess to unlock the handle.

3. The unlock mechanism of claim 2, further comprising a first elastic member disposed in the handle, opposite ends of the first elastic member abutting against the handle and the operating member respectively.

4. The unlock mechanism of claim 1, further comprising a fixing shaft disposed on the pivot shaft to rotatably restrain the handle on the socket.

5. The unlock mechanism of claim 1, wherein the inclined surface is a curved surface.

6. The unlock mechanism of claim 1, wherein the driving member further comprises an extending portion and the moving member is connected to the extending portion.

7. The unlock mechanism of claim 6, wherein the moving member is formed on the extending portion integrally.

8. The unlock mechanism of claim 1, wherein the socket further comprises an accommodating recess, a shape of the accommodating recess corresponds to a shape of the driving member, and the driving member is accommodated in the accommodating recess.

9. The unlock mechanism of claim 1, further comprising a cover, the socket further comprising an opening, the cover being movably disposed on the socket and covering the opening.

10. The unlock mechanism of claim 1, further comprising a second elastic member disposed in the socket, opposite ends of the second elastic member abutting against the socket and the driving member respectively.

11. The unlock mechanism of claim 1, further comprising a third elastic member disposed in the socket and sleeved on the moving member, opposite ends of the third elastic member abutting against the socket and the moving member respectively.

12. The unlock mechanism of claim 1, further comprising a torsion spring, opposite ends of the torsion spring being connected to the socket and the handle respectively.

13. The unlock mechanism of claim 12, wherein the pivot shaft comprises a pillar and the torsion spring is sleeved on the pillar.

14. A server comprising:
a chassis;
at least one rail disposed at a side of the chassis;
at least one engaging mechanism disposed on the at least one rail; and
at least one unlock mechanism disposed on the chassis, each unlock mechanism comprising:

a socket comprising a pivot hole;

a handle comprising a pivot shaft, the pivot shaft being rotatably disposed in the pivot hole;

a driving member movably disposed in the socket and sleeved on the pivot shaft, the driving member comprising an inclined surface;

a driving shaft disposed on the pivot shaft and abutting against the inclined surface; and a moving member connected to the driving member;

wherein the handle rotates to drive the driving shaft to rotate, the driving shaft pushes the inclined surface to drive the driving member to move, and the driving member drives the moving member to move toward the engaging mechanism to push the engaging mechanism.

15. The server of claim 14, wherein the unlock mechanism further comprises an operating member movably disposed in the handle, the operating member comprises a press portion and a restraining portion, the press portion is exposed from the handle, the handle further comprises a through hole, the through hole is located at an end of the pivot shaft, the socket further comprises a restraining recess, the restraining recess communicates with the pivot hole, the restraining portion passes through the through hole to engage with the restraining recess to lock the handle, and the press portion is pressed to disengage the restraining portion from the restraining recess to unlock the handle.

16. The server of claim 14, wherein the unlock mechanism further comprises a fixing shaft disposed on the pivot shaft to rotatably restrain the handle on the socket.

17. The server of claim 14, wherein the socket further comprises an accommodating recess, a shape of the accommodating recess corresponds to a shape of the driving member, and the driving member is accommodated in the accommodating recess.

18. The server of claim 14, wherein the unlock mechanism further comprises a cover, the socket further comprises an opening, and the cover is movably disposed on the socket and covers the opening.

19. The server of claim 14, wherein a number of the at least one rail is two, a number of the at least one engaging mechanism is two, a number of the at least one unlock mechanism is two, two rails are disposed at opposite sides of the chassis, two engaging mechanisms are disposed on the two rails, two unlock mechanisms are disposed at opposite sides of the chassis with respect to the two engaging mechanisms, and rotating directions of two handles of the two unlock mechanisms are opposite.

* * * * *